United States Patent [19]

Olsen et al.

[11] 4,116,733
[45] Sep. 26, 1978

[54] VAPOR PHASE GROWTH TECHNIQUE OF III-V COMPOUNDS UTILIZING A PREHEATING STEP

[75] Inventors: Gregory Hammond Olsen, Dayton, N.J.; Thomas Joseph Zamerowski, Yardley; Charles Joseph Buiocchi, Levittown, both of Pa.

[73] Assignee: RCA Corporation, New York, N.Y.

[21] Appl. No.: 840,039

[22] Filed: Oct. 6, 1977

[51] Int. Cl.² ........................ H01L 21/205
   H01L/29/30; H01L/29/38
[52] U.S. Cl. .................... 148/175; 148/1.5;
   148/174; 156/612; 156/613; 156/614
[58] Field of Search ............ 148/174, 175, 1.5;
   156/612, 613, 614; 427/87, 226; 118/49.5

[56] References Cited

U.S. PATENT DOCUMENTS

| | | | |
|---|---|---|---|
| 3,314,393 | 4/1967 | Haneta | 148/175 X |
| 3,441,453 | 4/1969 | Conrad et al. | 148/175 |
| 3,473,510 | 10/1969 | Sheng et al. | 118/49.5 |
| 3,480,491 | 11/1969 | Reisman et al. | 148/175 X |
| 3,615,931 | 10/1971 | Arthur | 148/175 |
| 3,672,948 | 6/1972 | Foehring et al. | 118/49.5 |
| 3,893,876 | 7/1975 | Akai et al. | 148/175 |
| 3,984,263 | 10/1976 | Asao et al. | 156/614 X |

OTHER PUBLICATIONS

Tietjen et al., "Preparation — GaAsP using Arsine and Phosphine" J. Electrochem. Soc., vol. 113, No. 7, Jul. 1966, pp. 724-728.

Gabor, T., "Epitaxial Growth of Gallium Arsenide on Germanium Substrates" IBID., vol. 111, No. 7, Jul. 1964, pp. 817-820.

Barber, G. F., "Two-Chamber Air-to-Vacuum Lock System" I.B.M. Tech. Discl. Bull., vol. 11, No. 7, Dec. 1968, pp. 757-758.

Grochowski et al., "Slow Cooling to Minimize Distortion —" IBID., vol. 14, No. 5, Oct. 1971, p. 1640.

Primary Examiner—L. Dewayne Rutledge
Assistant Examiner—W. G. Saba
Attorney, Agent, or Firm—H. Christoffersen; B. E. Morris

[57] ABSTRACT

In the vapor phase epitaxy fabrication of semiconductor devices and in particular semiconductor lasers, the deposition body on which a particular layer of the laser is to be grown is preheated to a temperature about 40° to 60° C. lower than the temperature at which deposition occurs. It has been discovered that by preheating at this lower temperature there is reduced thermal decomposition at the deposition surface, especially for semiconductor materials such as indium gallium phosphide and gallium arsenide phosphide. A reduction in thermal decomposition reduces imperfections in the deposition body in the vicinity of the deposition surface, thereby providing a device with higher efficiency and longer lifetime.

5 Claims, 4 Drawing Figures

VAPOR PHASE GROWTH TECHNIQUE OF III-V COMPOUNDS UTILIZING A PREHEATING STEP

The Government has rights in this invention pursuant to Contract No. NAS1-14349 awarded by NASA, the National Aeronautics and Space Administration.

The present invention relates to vapor phase growth techniques and in particular to improved vapor phase growth techniques for III-V compound semiconductor devices.

BACKGROUND OF THE INVENTION

It is well understood by those skilled in the semiconductor art that a III-V semiconductor compound is one which includes elements from group III and V of the Periodic Table of Elements.

Many III-V heterojunction devices, such as transmission photocathodes and lasers, depend greatly on high quality, defect-free interfaces for good performance. Even after defect-free interfaces have been obtained, thermal decomposition can still severely limit device properties. It has been discovered that many III-V heretojunction devices, and in particular lasers grown by vapor phase epitaxial techniques, have suffered from thermal decomposition at the interfacial regions. The thermal decomposition results in defects in the deposition body in the area of the deposition surface which causes reduced device efficiency and reduced device lifetime.

The vapor phase growth of many multi-layered III-V hetetojunction devices typically include the preheating of the depositing body and deposition surface at the temperature used for deposition of the growth layer. Typically, for material such as indium gallium arsenide and gallium arsenide phosphide, this temperature is about 700°. It is believed that those skilled in the art did not realize that preheating of III-V materials like indium gallium phosphide or gallium arsenide phosphide to a temperature of 700° C. would cause thermal decomposition. Applicants have found from studying transmission electron micrographs that there is thermal decomposition at the decomposition surface. The thermal decomposition produces many dislocation loops in the area of the deposition surface which in turn degrade minority carrier device properties. These discoloration loops are due to incongruent evaporation at the deposition surface during the preheating cycle. Therefore, the elimination of this thermal decomposition problem would improve semiconductor device performance and would in general be most desirable in the semiconductor device field.

SUMMARY OF THE INVENTION

The present process describes a method of fabricating a III-V semiconductor device by vapor phase deposition of a semiconductor layer on a deposition body whereby the deposition body is preheated to a temperature about 40° to 60° C. lower than the deposition temperature.

DETAILED DESCRIPTION OF THE INVENTION

Figure 1:
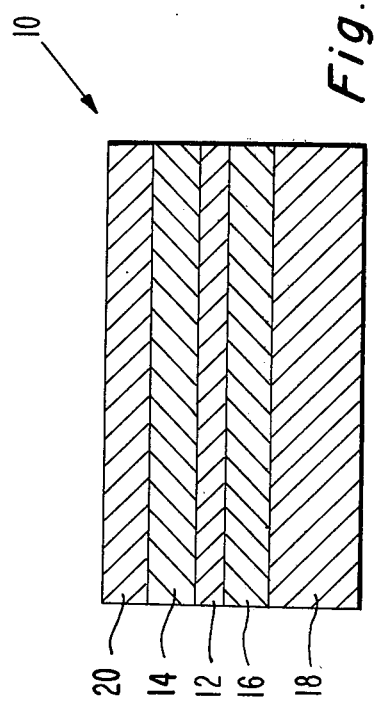
FIG. 1 is a cross-sectional view of a semiconductor laser which may be fabricated by the method of the present invention.

Referring to FIG. 1, a gallium arsenide phosphide and indium gallium phosphide semiconductor laser is set forth herein for the purpose of describing the method of the present invention, although the method of the present invention can be utilized in the fabrication of many other III-V semiconductor devices as well. The semiconductor laser is herein designated as 10.

The semiconductor laser 10 includes an active layer 12 of $GaAs_{1-x}P_x$ where x is beteen about 0.1 and 0.4. Contiguous to the active layer 12 and spaced opposite each other are first and second confining layers 14 and 16, each of $In_yGa_{1-y}P$, where y is between about 0.25 and 0.5. Typically, the active layer 12 is undoped and the first confining layer 14 is of P type conductivity and the second confining layer 16 is of N type conductivity. The second confining layer 16 is on a surface of a substrate 18 opposite the active layer 12. The substrate 18 is of a material capable of forming an ohmic contact with the second confining layer 16, e.g., $GaAs_{.7}P_{.3}$, and is of the same conductivity type as the second confining layer 16. On a surface of the first confining layer 14 is an electrode 20 of a material capable of forming an ohmic contact to the first confining layer 14. The electrode 20 is of the same conductivity type as the first confining layer 14 and for purposes of the present invention it is of $GaAs_{0.68}P_{0.32}$. Typically, the active layer 12 is about 0.2 micrometer in thickness and each of the first and second confining layers 14 and 16 are about 1 micrometer in thickness; the substrate 18 is about 250–300 micrometers in thickness; and the electrode 20 is about 1 micrometer in thickness. The conductivity concentration of the first confining layer 14 is assumed to be about $5 \times 10^{18}/cm^3$ and that of the second confining layer 16 is about $5 \times 10^{17}/cm^3$, while the conductivities of the substrate 18 and electrode 20 are about $5 \times 10^{17}/cm^3$ and $1 \times 10^{19}/cm^3$ respectively.

The semiconductor laser 10 is operated under forward biased conditions at a threshold current density value of about 3400 amperes per centimeter squared or greater. The active layer 12's coherent emission of the semiconductor laser 10 is at a wavelength of about 7000 angstroms. The first and second confining layers 14 and 16 are of a higher bandgap energy and lower index of refraction than the active layer 12, so as to provide optical confinement of generated radiation and electrical confinement of free carriers generated in the active layer 12.

In the method of the present invention, prior to depositing a vapor grown layer onto a substrate or onto a previously grown layer (hereinafter referred to as the deposition body), the deposition body is placed in a preheat zone of a vapor phase growth apparatus for approximately 3.5 minutes at a temperature about 40°–60° C. lower than the temperature of the deposition zone, i.e., the temperature at which the subsequently grown layer is to be deposited. It has been discovered that if the deposition body is preheated to a temperature about the same as the temperature of the deposition zone, thermal decomposition occurs at the depositing surface. This thermal decomposition at the decomposition surface is evidenced in the form of dislocation loops in the deposition body in the area of the deposition surface. These dislocations loops will in turn degrade minority carrier device properties and thus degrade device lifetime and efficiency. This is especially apparent in a laser such as semiconductor laser 10, where the active layer is very thin, i.e. about 0.2 micrometers, when thermal decomposition will occur throughout the entire active layer.

Preheating the semiconductor body is necessary because a cold deposition body subjected to a hot deposition gas stream will not produce single crystalline layers. However, preheating at the deposition temperature is detrimental to forming a good interface between layers.

A first layer is then deposited on the deposition body by conventional vapor phase epitaxy techniques.

After a first layer has been grown the deposition body is removed to the forechamber of the vapor phase growth apparatus where it is cooled and placed in an inert atmosphere. Meanwhile the gases in the deposition zone are exhausted and the gases for deposition of the next layer are then bled into the deposition zone again prior to placing the deposition body into the deposition zone. The deposition body is again preheated at a temperature about 40° to 60° C. lower than the deposition zone temperature and then placed in the deposition zone. This procedure is repeated for subsequently grown layers.

Figure 2:
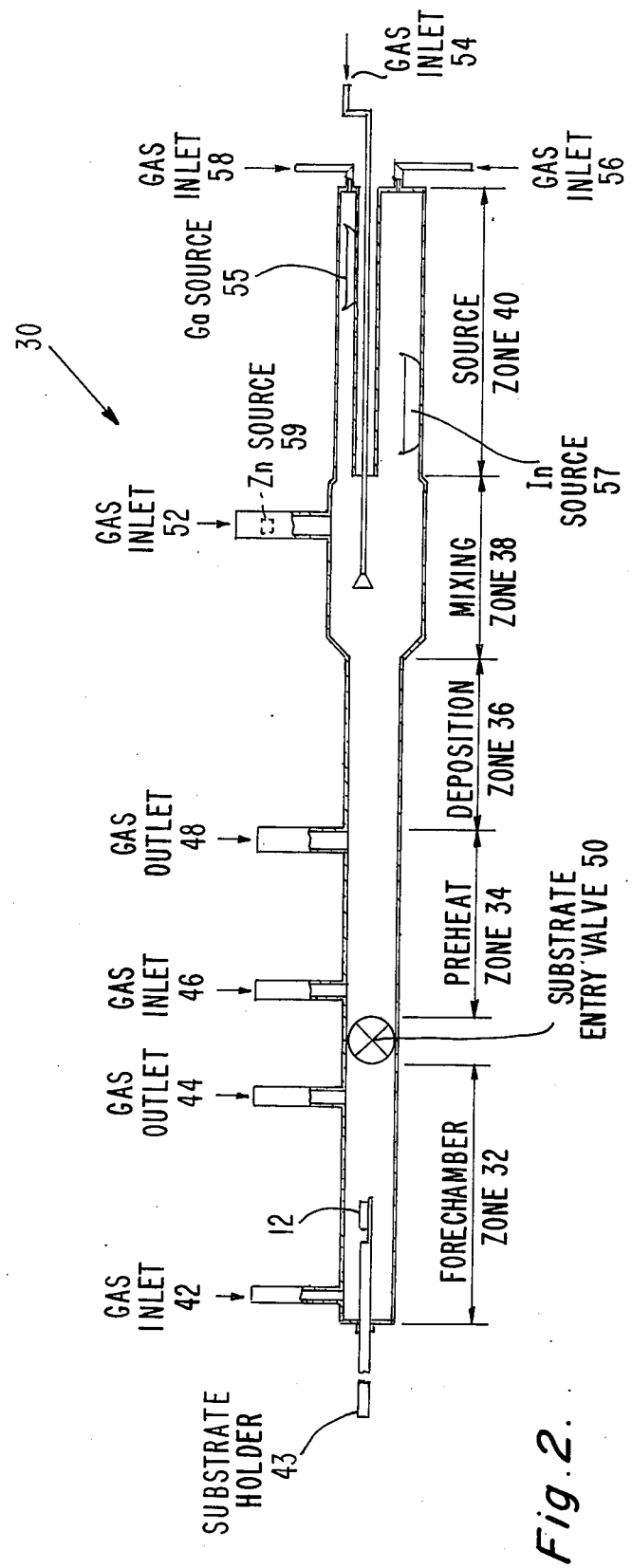
FIG. 2 is a side view of an apparatus suitable for carrying out the method of the present invention.

Referring to FIG. 2, a vapor phase growth apparatus suitable for utilizing the method of the present invention and for fabricating the semiconductor laser 10 is designated as 30. For the purpose of describing the method of the present invention, the vapor phase growth apparatus 30 has been designated having specific fabrication zones. These fabrication zones include a forechamber zone 32, a preheat zone 34, a deposition zone 36, a mixing zone 38 and a source zone 40. The forechamber zone 32 has a gas inlet 42 and a gas outlet 44, the preheat zone 34 has a gas inlet 46 and a gas outlet 48. Separating the forechamber zone 32 and the preheat zone 34 is a substrate entry valve 50. The mixing zone 38, where the deposition gases are equilibrated, has a gas inlet 52 and also extending into the mixing zone 38 is a gas inlet 54. The source zone 40 has two chambers, each containing source material, with a gas inlet 56 in one chamber and a gas inlet 58 in the other chamber. Slidably mounted onto the vapor phase growth apparatus 30 is a substrate holder 43 which enters the apparatus 30 first through the forechamber zone 32 and can then be sequentially slid through the other fabrication zones. The substrate holder 43 is typically of a quartz rod which has a platform at one end for retaining the deposition body.

To demonstrate the present invention more precisely the subsequent example describes the fabrication of the semiconductor laser 10.

EXAMPLE

Part A - Deposition of the Second Confining Layer 16

A substrate 18 of N-type gallium arsenide phosphide of the composition, $GaAs_{0.7}P_{0.3}$ is degreased and etched in Caro's acid. The substrate 18 is doped with $5 \times 10^{17}$ atoms per cubic centimeter of tellurium. After etching, the substrate 18 is placed on the substrate holder 43 and slid into the forechamber zone 32. While in the forechamber zone 32, the substrate 18 is flushed with an inert gas such as hydrogen. The inert gas enters and leaves the forechamber zone 32 through the gas inlet 42 and gas outlet 44 respectively. The substrate 18 is then slid through the substrate entry valve 50 into the preheat zone 34 which is at a temperature of 675° C. and rotated in a flowing atmosphere of a mixture of 900 cubic centimeters per minute (ccpm) of 10% by volume phosphine in hydrogen and 900 ccpm of 10% by volume arsine in hydrogen until the substrate reaches a temperature of about 650° C. The flowing atmosphere in the preheat zone 34 enters and exits through the gas inlet 46 and gas outlet 48.

Upon attaining the appropriate temperature, the substrate 18 is then slid into the deposition zone 36 for deposition of the second confining layer 16 of indium gallium phosphide of the composition $In_{0.33}Ga_{0.67}P$. The second confining layer 16 is of N-type conductivity doped with $5 \times 10^{17}$ atoms per cubic centimeter of sulphur. The gases in the deposition zone 36 have been equilibrated after passing through the mixing zone 38 at the temperature of about 850° C. The gases equilibrated in the mixing zone 38 and forming the deposition gas include hydrogen chloride gas flowing at a rate of 5.6 ccpm over a gallium source 55 which is in one chamber of the source zone 40; hydrogen chloride gas flowing at a rate of 54 ccpm over an indium source 57 in the other chamber of the source zone 40; hydrogen gas at a flow rate of 5000 ccpm bled in through gas inlet 54; and 50 parts per million of hydrogen sulfide gas at a flow rate of 60 ccpm bled in through gas inlet 54. The gallium and indium sources 55 and 57 are typically at temperatures of about 850° C. The substrate 18 is held in the deposition zone 36 for about 5 minutes at 700° C. for deposition of a one micron thick layer 16 of $In_{0.33}Ga_{0.67}P$. After approximately 5 minutes the substrate 18 is withdrawn from the deposition zone 36 to the forechamber zone 32 where rotation of the substrate is stopped and the substrate is allowed to cool to room temperature while gas flows for the next layer are established.

Part B - Deposition of Active Layer 12

The substrate 18 is then removed from the forechamber zone 32 and slid into the preheat zone 34, and rotated and heated at about 675° C. in an atmosphere of about 10% by volume hydrogen phosphide in hydrogen at a flow rate of 1800 ccpm until the substrate 18 reaches a temperature of about 650° C. The substrate 18 is then moved into the deposition zone 36 where the gas flows for deposition of the undoped active layer 12 of gallium arsenide phosphide ($GaAs_{0.68}P_{0.32}$) has been established at 5.4 ccpm hydrogen chloride gas flowing over the gallium source 55; 6.0 ccpm of phosphine, 16.0 ccpm of arsine and 5000 ccpm of hydrogen. The substrate 18 is retained in the deposition zone 36 for about 1 minute at 700° C. for the growth of an active layer 12 of a thickness of about 0.2 micrometer. The active layer 12 is, of course, grown on the previously grown second confining layer 16. The substrate 18 is again withdrawn to the forechamber zone 32 and allowed to cool to room temperature while the gas flows for deposition for the next layer are established.

Part C — Deposition of the First Confining Layer 14

The substrate 18 is removed from the forechamber zone 32 and preheated as described in Part A. It is then inserted into the deposition zone 36 as in Part A for 5 minutes so as to form a first confining layer 14 of indium gallium phosphide ($In_{0.33}Ga_{0.67}P$) of P-type conductivity doped with about $5 \times 10^{18}$ atoms per cubic centimeter of zinc. The first confining layer 14 is formed on the active layer 12. The gas flow rates are the same as in Part A, except that instead of the hydrogen sulfide doping gas, hydrogen bled in from gas inlet 52 at about 70 ccpm was passed over a zinc source 59 at about 375° C. to form a doping gas containing elemental zinc. The zinc source 59 is in the gas inlet 52. The substrate 18 is again withdrawn to the forechamber zone 32 as in Part A.

Part D — Deposition of Electrode 20

The substrate 18 is again removed from the forechamber zone 32 and preheated as described in Part B. It is then slid into the deposition zone 36 as in Part B for about 5 minutes for the deposition of a 1 micrometer thick electrode 20 of gallium arsenide phosphide ($GaAs_{0.68}P_{0.32}$). The electrode 20 is of P-type conductivity doped with about $1 \times 10^{19}$ atoms per cubic centimeter of zinc. The doping gas in this instance was formed by passing hydrogen at 700 ccpm over the zinc source 59 which was at a temperature of about 400° C. The substrate 18 and the grown layers 16, 14, 12 and 18 are then removed to the forechamber zone 32 and allowed to cool to room temperature before being removed from the apparatus 30.

Figure 3:
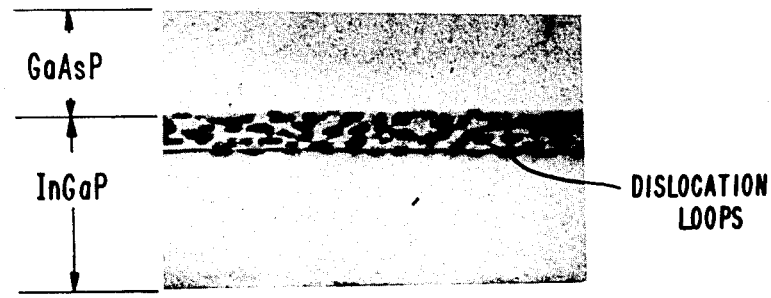
FIG. 3 is a cross-sectional electron micrograph of the interfacial region between a gallium arsenide phosphide layer and an indium gallium phosphide layer made by prior art techniques.
Figure 4:
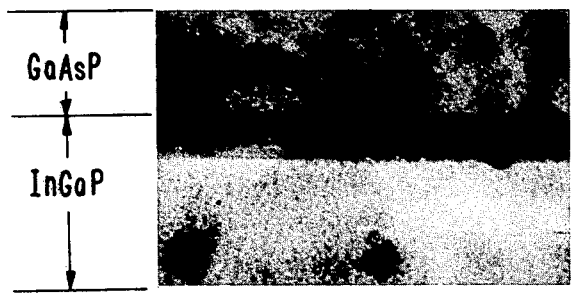
FIG. 4 is a cross-sectional electron micrograph of the interfacial region between a gallium arsenide phosphide layer and an indium gallium phosphide layer made according to the method of the present invention.

The advantageous effect of the present invention is illustrated by reference to FIGS. 3 and 4. Both FIGS. 3 and 4 are micrographs that show a vapor grown indium gallium phosphide layer about 3 micrometers in thickness contiguous to a gallium arsenide phosphide layer about 1 micrometer in thickness. In FIG. 3 the vapor grown indium gallium phosphide layer was preheated to a temperature of 700° C. after which a vapor grown gallium arsenide phosphide layer was deposited thereon. Defects in the crystal structure appear in the electron micrographs as dark areas since crystal defects scatter the impinging electrons of the electron microscope. In FIG. 3 the defects, i.e., dislocation loops, formed as a result of thermal decomposition, appear as dark loops in the indium gallium phosphide layer in the vicinity of its interface with the gallium arsenide phosphide layer.

FIG. 4 shows the interfacial region of the same layers as those of FIG. 3. However, in the vapor deposition of the gallium arsenide phosphide layer, the indium gallium phosphide layer was preheated to a temperature of about 650° C. No defects in the indium gallium phosphide layer in the region of the layer interfaces due to thermal decomposition are apparent. The applicants attribute this reduction in crystal defects to the method of the present invention.

In the method of the present invention, III-V semiconductor devices, and in particular gallium arsenide phosphide/indium gallium phosphide semiconductor lasers, can be fabricated without the detrimental consequences of thermal decomposition on deposition surfaces.

We claim:

1. In the method of fabricating a III-V semiconductor device wherein a semiconductor layer is vapor phase deposited onto a deposition body having a deposition surface and the deposition body is preheated prior to deposition, the improvement wherein the preheating step comprises:
    preheating said deposition body to a temperature about 40° to 60° C. lower than the temperature of deposition for a predetermined period of time prior to raising the temperature of the body to the temperature of deposition.

2. The method in accordance with claim 1 wherein the III-V semiconductor material at the deposition surface of the deposition body is gallium arsenide phosphide.

3. The method in accordance with claim 1 wherein the III-V semiconductor material at the deposition surface of the deposition body is indium gallium phosphide.

4. A method for making a III-V semiconductor device having an active layer of $GaAs_{1-x}P_x$, wherein $x$ is between about 0.1 and 0.4, a first and a second confining layer contiguous to said active layer and opposite each other, said first and second confining layers composed of $In_yGa_{1-y}P$, wherein y is between about 0.25 and 0.5, a substrate of gallium arsenide phosphide contiguous to the second confining layer, and opposite the first confining layer layer, and an electrode on the first confining layer opposite the active layer said electrode composed of gallium arsenide phosphide comprising the steps of:
    (a) preheating said substrate to a temperature between about 640° C. and 660° C. in an atmosphere of arsine and phosphine,
    (b) depositing said first confining layer on said substrate by vapor deposition at about 700° C.,
    (c) preheating the substrate from Step (b) to between about 640° C. and 660° C. in an atmosphere of phosphine,
    (d) depositing the active layer on said first confining layer from Step (b) by vapor deposition at about 700° C.,
    (e) preheating the substrate from Step (d) to a temperature between about 640° C. and 660° C. in an atmosphere of arsine and phosphine,
    (f) depositing on said active layer from Step (d) the second confining layer by vapor deposition at about 700° C.,
    (g) preheating the substrate from Step (f) to a temperature between about 640° C. in an atmosphere of phosphine,
    (h) depositing on said second confining layer from Step (f) the electrode layer by vapor deposition at about 700° C.

5. A method according to claim 4 wherein the substrate is cooled to about room temperature after the deposition of each successive layer.

* * * * *